United States Patent
Balakrishnan et al.

(10) Patent No.: US 9,166,575 B2
(45) Date of Patent: Oct. 20, 2015

(54) LOW THRESHOLD VOLTAGE COMPARATOR

(71) Applicant: Power Integrations, Inc., San Jose, CA (US)

(72) Inventors: Balu Balakrishnan, Saratoga, CA (US); Alex B. Djenguerian, Saratoga, CA (US); Leif Lund, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 282 days.

(21) Appl. No.: 13/791,723

(22) Filed: Mar. 8, 2013

(65) Prior Publication Data

US 2014/0254202 A1    Sep. 11, 2014

(51) Int. Cl.
 *H03K 5/153* (2006.01)
 *H03K 5/08* (2006.01)
 *H02M 3/335* (2006.01)
 *H03K 5/24* (2006.01)

(52) U.S. Cl.
 CPC ........... *H03K 5/084* (2013.01); *H02M 3/33576* (2013.01); *H03K 5/2436* (2013.01); *H02M 3/33592* (2013.01); *Y02B 70/1475* (2013.01)

(58) Field of Classification Search
 CPC ..... H03K 5/084; H03K 5/153; H03K 5/1536; H03K 5/2436
 USPC ............ 327/50, 77, 78, 79, 80, 81, 85, 88, 89
 See application file for complete search history.

(56) References Cited

U.S. PATENT DOCUMENTS

| | | | |
|---|---|---|---|
| 4,213,098 A * | 7/1980 | Tsividis | 330/253 |
| 4,453,094 A * | 6/1984 | Peil et al. | 326/36 |
| 5,162,970 A | 11/1992 | Davis, Jr. et al. | |
| 5,650,357 A | 7/1997 | Dobkin et al. | |
| 5,731,721 A * | 3/1998 | Gantioler et al. | 327/81 |
| 6,384,478 B1 | 5/2002 | Pour | |
| 6,812,686 B2 * | 11/2004 | Chaoui | 324/95 |
| 6,998,952 B2 | 2/2006 | Zhou et al. | |

(Continued)

FOREIGN PATENT DOCUMENTS

| | | |
|---|---|---|
| JP | H 09-260569 | 10/1997 |
| WO | WO 86/04197 | 7/1986 |

OTHER PUBLICATIONS

International Application No. PCT/US2014/022112—PCT International Search Report and Written Opinion, mailed Oct. 10, 2014 (13 pages).

*Primary Examiner* — William Hernandez

(74) *Attorney, Agent, or Firm* — Blakely Sokoloff Taylor & Zafman LLP

(57) ABSTRACT

A voltage comparator includes an amplifier coupled to receive an input signal at an amplifier input and generate an output signal at an amplifier output in response to the input signal. The amplifier includes a current generation circuit coupled to generate a first current flowing through a first branch and a second current flowing through a second branch. A first transistor has a first terminal coupled to the amplifier input and a second terminal coupled to the first branch. A second transistor has a third terminal coupled to the second branch, a fourth terminal coupled to a reference voltage. A second control terminal of the second transistor is coupled to the first control terminal. An output circuit is coupled to the amplifier output to generate a comparator output signal in response to the output signal. The amplifier output is coupled to the second branch.

12 Claims, 4 Drawing Sheets

(56) References Cited

U.S. PATENT DOCUMENTS

| | | |
|---|---|---|
| 7,468,547 B2 | 12/2008 | Harvey |
| 7,524,731 B2 | 4/2009 | Wang |
| 7,619,297 B2 | 11/2009 | Wang |
| 7,868,431 B2 | 1/2011 | Feng et al. |
| 7,884,696 B2 | 2/2011 | Hébert et al. |
| 8,093,983 B2 | 1/2012 | Fouquet et al. |
| 8,772,909 B1 | 7/2014 | Vinciarelli |
| 2004/0214376 A1 | 10/2004 | Gibson et al. |
| 2005/0271148 A1 | 12/2005 | Dupuis |
| 2008/0084232 A1 | 4/2008 | Huang et al. |
| 2009/0284995 A1 | 11/2009 | Sato |
| 2012/0139606 A1* | 6/2012 | Dina et al. .................... 327/333 |

* cited by examiner

LOW THRESHOLD VOLTAGE COMPARATOR

BACKGROUND INFORMATION

1. Field of the Disclosure

The present invention relates generally to power converters. More specifically, examples of the present invention are related to controlling a power converter in response to certain signals from the power converter.

2. Background

Switch mode power converters are widely used for household or industrial appliances that require a regulated direct current (dc) source for their operation, such as for example battery chargers that are commonly used in electronic mobile devices. Off-line ac-dc converters convert a low frequency (e.g., 50 Hz or 60 Hz) high voltage ac (alternating current) input voltage to a required level of dc output voltage. Various types of switch mode power converters are popular because of their well regulated output, high efficiency, and small size along with their safety and protection features. Popular topologies of switch mode power converters include flyback, forward, boost, buck, half bridge, and full bridge, among many others including resonant types.

A major challenge in the market of switch mode power converters is reducing the size and cost of the switch mode power converter while maintaining high performance operating specifications, including efficiency. To increase efficiency, power converters may include a control circuit to control switches and/or other circuitry in the power converter in response to sensing certain input signals at specific nodes of the power converter. In some applications, the control circuit may control a switch in response to an input signal that may vary between a relatively wide range of voltages. Furthermore, the control circuit may need to detect that the input signal has crossed a certain threshold and adjust an output signal accordingly. It may also be desirable for the control circuit to quickly respond to a given input signal in order to increase the efficiency of the power converter. In some instances, the threshold may be a voltage that is below the negative supply voltage rail of the control circuit. In some instances, the threshold may be low (small in magnitude).

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
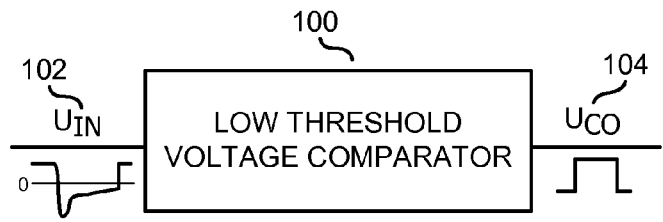
FIG. 1 shows a block diagram of a low threshold voltage comparator coupled to generate a comparator output signal in response to an input signal, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1 shows a block diagram of a low threshold voltage comparator 100 coupled to generate a comparator output signal $U_{CO}$ 104 in response to an input signal $U_{IN}$ 102, in accordance with the teachings of the present invention. As shown, input signal $U_{IN}$ 102 may be a voltage signal that may have positive and/or negative portions and comparator output signal $U_{CO}$ 104 may be a digital voltage signal with logic low and logic high levels. In operation, low threshold voltage comparator 100 transitions comparator output signal $U_{CO}$ 104 from one logic level to another level (e.g., from logic low to logic high) when input signal $U_{IN}$ 102 crosses a threshold. In one example, low threshold voltage comparator 100 sets comparator output signal $U_{CO}$ 104 to logic high when input signal $U_{IN}$ 102 goes below a negative threshold voltage and similarly, sets comparator output signal $U_{CO}$ 104 to logic low when input signal $U_{IN}$ 102 goes above the negative threshold voltage. In one example, the negative threshold voltage is approximately −20 mV.

Figure 2:
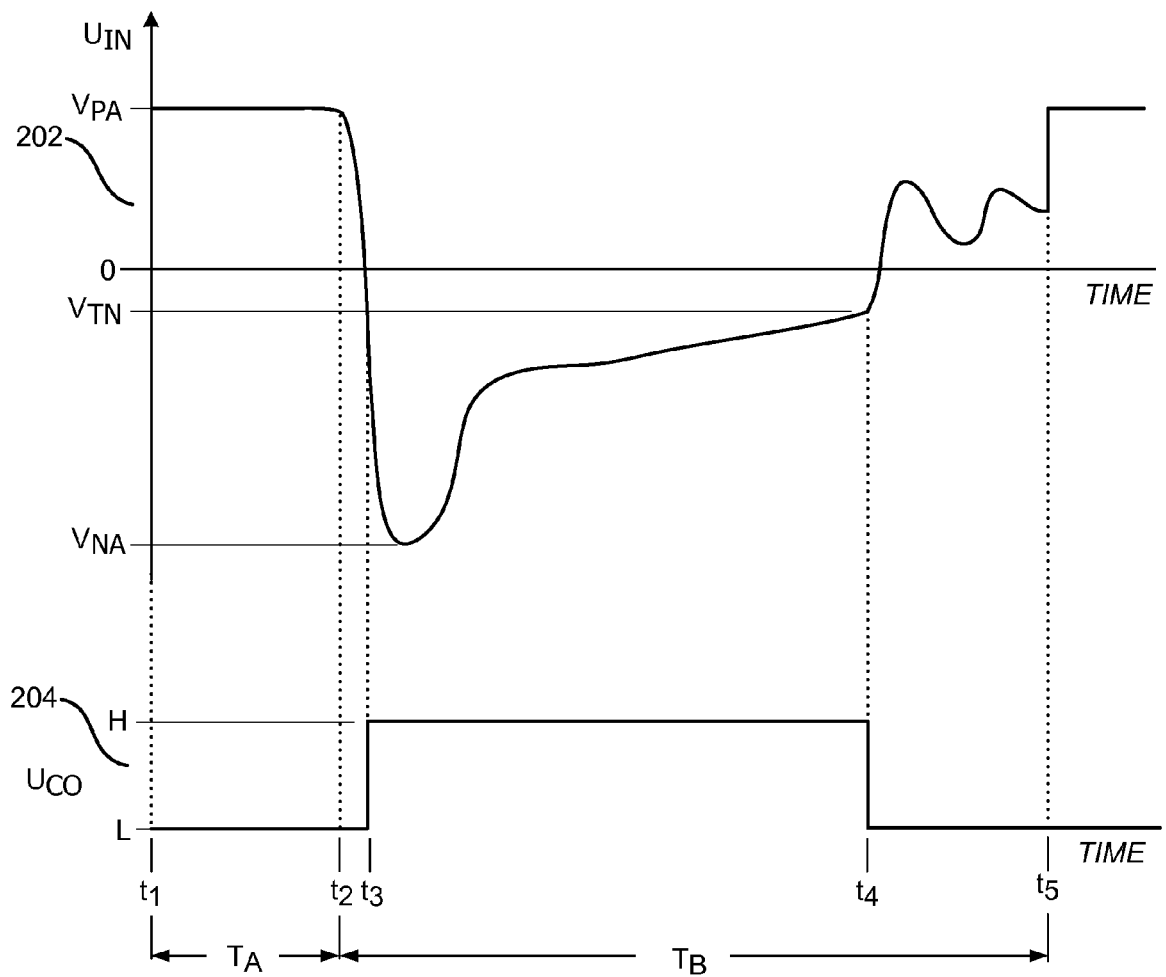
FIG. 2 shows a timing diagram illustrating one example of an analog input signal that may be received by a low threshold voltage comparator and a comparator output signal generated by the low threshold voltage comparator in response to receiving the analog input signal, in accordance with the teachings of the present invention.

FIG. 2 shows a timing diagram illustrating one example of an analog input signal that may be received by a low threshold voltage comparator and a comparator output signal generated by the low threshold voltage comparator in response to receiving the analog input signal, in accordance with the teachings of the present invention. Waveform 202 is one example of input signal $U_{IN}$ 102 and waveform 204 is one example of comparator output signal $U_{CO}$ 104. As shown, waveform 202 stays substantially constant at a positive voltage $V_{PA}$ for a time period $T_A$ between time $t_1$ and time $t_2$. Also illustrated in FIG. 2, during a time period $T_B$ between time $t_2$ and time $t_5$, waveform 202 initially decreases from the positive voltage $V_{PA}$ down to a negative voltage $V_{NA}$ (crossing a negative threshold $V_{TN}$, which is representative of the negative threshold voltage, along the way). Then, waveform 202 rises to a positive voltage, crossing the negative threshold $V_{IN}$ again, and eventually reaches the positive voltage $V_{PA}$ at time $t_5$. In one example, the positive voltage $V_{PA}$ is approximately 4.3V and the negative voltage $V_{NA}$ is approximately −1.5V. Waveform 202 may be a typical waveform of a voltage that is representative of a voltage across a synchronous rectifier switch on the secondary side of a flyback power converter during one switching period. Specifically, the time period $T_A$ may represent an on-time of a primary switch of the power converter during a switching period and the time period $T_B$ may represent an off-time of the primary switch during the switching period.

As further illustrated in FIG. 2, waveform 204 is at a logic high level H when waveform 202 is below the negative threshold $V_{TN}$, such as between time $t_3$ and time $t_4$. Conversely, waveform 204 is at a logic low level L when waveform 202 is above the negative threshold $V_{TN}$, such as between time $t_1$ and time $t_3$.

Figure 3:
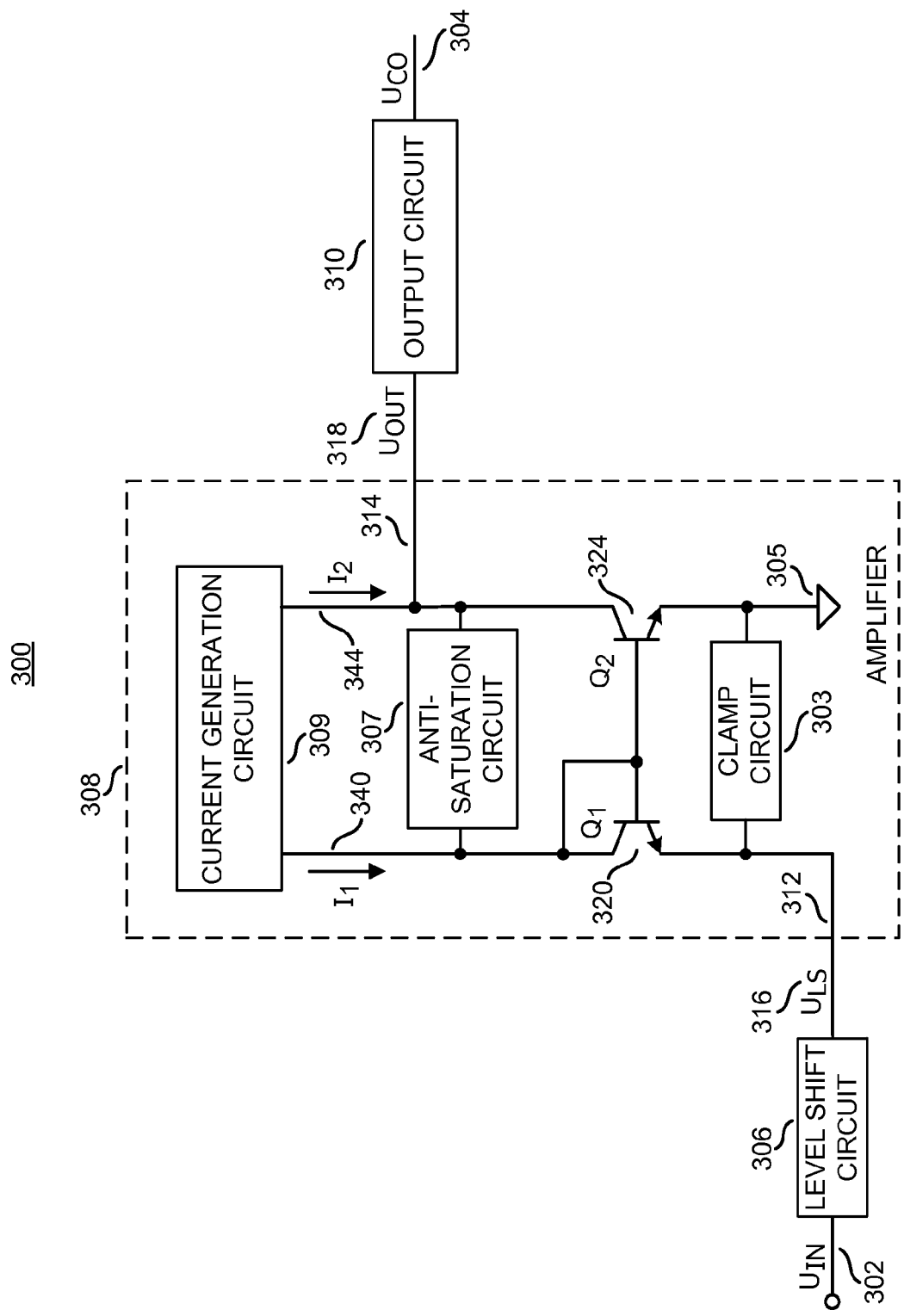
FIG. 3 illustrates a schematic-block diagram of an example low threshold voltage comparator that includes a level shift circuit, an amplifier, and an output circuit, in accordance with the teachings of the present invention.

FIG. 3 illustrates a schematic-block diagram of an example low threshold voltage comparator 300 that includes a level shift circuit 306, an amplifier 308, and an output circuit 310, in accordance with the teachings of the present invention. Low threshold voltage comparator 300 is one example of low threshold voltage comparator 100.

Level shift circuit 306 is coupled to receive input signal $U_{IN}$ 302 and generates a level-shifted input signal $U_{LS}$ 316 in response to input signal $U_{IN}$ 302. Level shift circuit 306 is further coupled to provide level-shifted input signal $U_{LS}$ 316 to amplifier 308. In one example, level shift circuit 306 generates level-shifted input signal $U_{LS}$ 316 by raising the voltage level of input signal $U_{IN}$ 302.

Amplifier 308 is coupled to receive level-shifted input signal $U_{LS}$ 316 at an amplifier input 312 and to produce an output signal $U_{OUT}$ 318 at an amplifier output 314 by amplifying level-shifted input signal $U_{LS}$ 316. In the illustrated example, amplifier 308 includes a current generation circuit 309, an anti-saturation circuit 307, a clamp circuit 303, and transistors $Q_1$ 320 and $Q_2$ 324.

Current generation circuit 309 is coupled to generate a first current $I_1$ 340 in a first branch and generate a second current $I_2$ 344 in a second branch. First current $I_1$ 340 and second current $I_2$ 344 may be substantially equal to each other. In one example, first current $I_1$ 340 and second current $I_2$ 344 are 10 µA. In other examples, first current $I_1$ 340 and second current $I_2$ 344 may be matched to substantially maintain a certain ratio.

Transistor $Q_1$ 320 has its emitter terminal coupled to amplifier input 312, its collector terminal coupled to the first branch and its base (controlling terminal) coupled to the collector. Transistor $Q_2$ 324 has its collector terminal coupled to the second branch and its base terminal coupled to the base of transistor $Q_1$ 320. In the illustrated example, the emitter terminal of transistor $Q_2$ 324 is coupled to a ground 305. In the illustrated example, ground 305 represents a reference voltage or potential against which all other voltages or potentials of low threshold voltage comparator 300 are defined or measured. In the example amplifier 308, transistors $Q_1$ 320 and $Q_2$ 324 are substantially identical bipolar junction transistors ("BJTs"). However, it is understood that in alternative implementations, other transistor types can be used in place of transistors $Q_1$ 320 and $Q_2$ 324. It is also understood that in some other cases, transistors $Q_1$ 320 and $Q_2$ 324 may substantially be ratio matched. In case of BJTs the ratio may be the ratio of the emitter area. In case of MOSFETs the ratio could be the ratio of width of the channels (W) with a substantially same channel length (L) or it could be a ratio of W/L between the transistors. In some instances the ratio matching of the transistors $Q_1$ 320 and $Q_2$ 324 may be substantially same as the ratio of first current $I_1$ 340 to second current $I_2$ 344.

Anti-saturation circuit 307 is coupled between the first branch and the second branch. In operation, anti-saturation circuit 307 prevents the saturation of transistor $Q_2$ 324 when level-shifted input signal $U_{LS}$ 316 crosses a first threshold voltage.

In FIG. 3, clamp circuit 303 is coupled between amplifier input 312 and ground 305 and ensures that level-shifted input signal $U_{LS}$ 316 does not reach substantially below a second threshold voltage. In one example, the second threshold voltage is −0.7 V and clamp circuit 303 clamps level-shifted input signal $U_{LS}$ 316 from going below −0.7V. In this manner, the voltage on the amplifier input 312 is prevented from going below the second threshold voltage although input signal $U_{IN}$ 302 may go well below the second threshold voltage (e.g., −1.5V)

Output circuit 310 is coupled to amplifier output 314 to generate comparator output signal $U_{CO}$ 304 in response to output signal $U_{OUT}$ 318 of amplifier 308. In operation, output circuit 310 sets comparator output signal $U_{CO}$ 304 to a logic high level when output signal $U_{OUT}$ 318 is above the threshold of output circuit 310 and similarly, sets comparator output signal $U_{CO}$ 304 to logic low when output signal $U_{OUT}$ 318 is below the threshold of output circuit 310.

Figure 4:
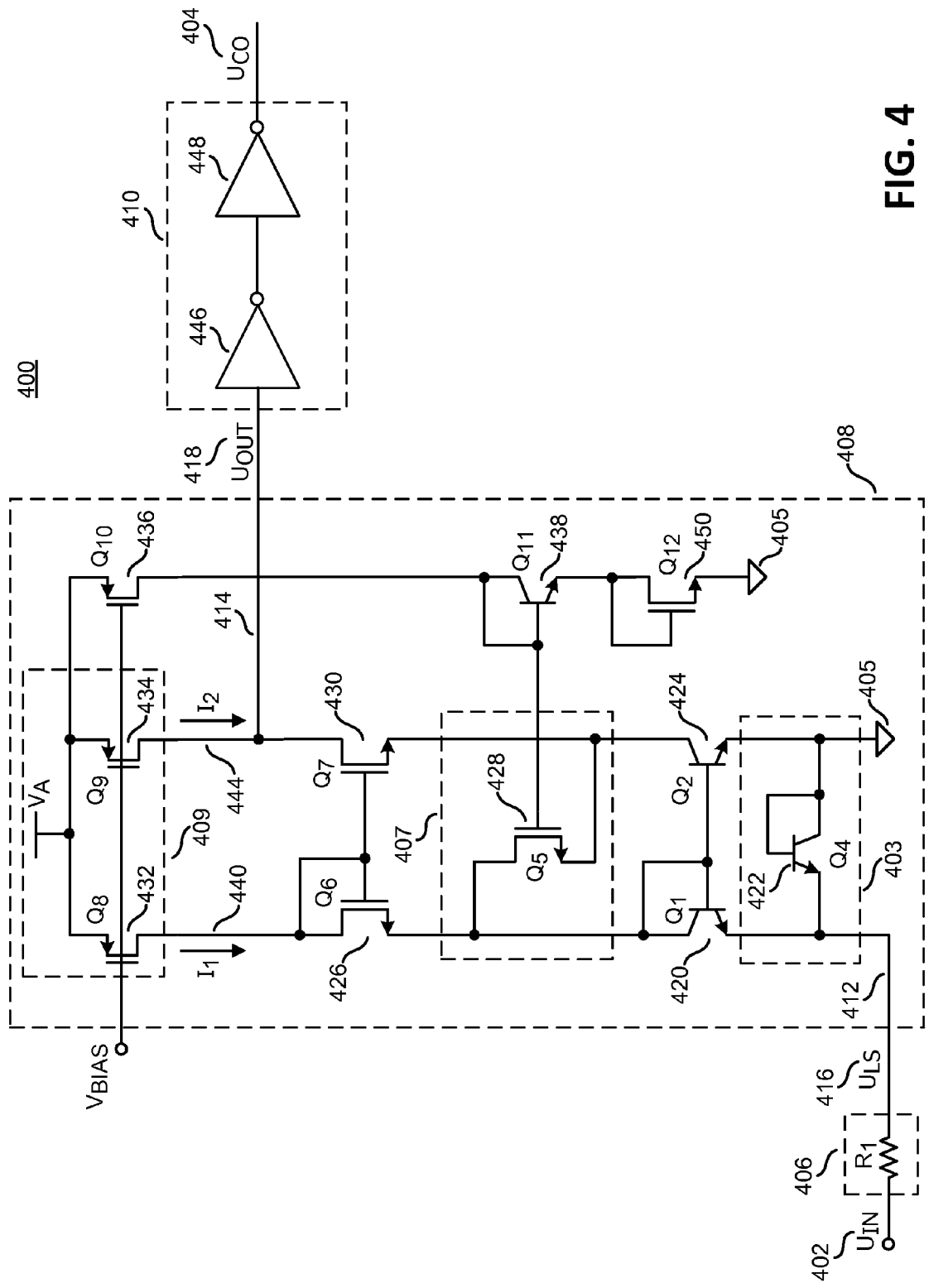
FIG. 4 illustrates one example of a more detailed schematic of the example low threshold voltage comparator illustrated in FIG. 3, in accordance with the teachings of the present invention.

FIG. 4 illustrates one example of a more detailed schematic of the example low threshold voltage comparator 300 illustrated in FIG. 3, in accordance with the teachings of the present invention. FIG. 4 shows a circuit schematic of a low threshold voltage comparator 400 including level shift circuit 406, amplifier 408, and output circuit 410. Amplifier 408 may be referred to as a differential amplifier, given its general architecture.

Current generation circuit 409 includes a pair of transistors, transistor $Q_8$ 432 and transistor $Q_9$ 434. In FIG. 4, transistor $Q_8$ 432 and transistor $Q_9$ 434 are illustrated as P-channel metal-oxide semiconductor field-effect transistors ("MOSFETs"). The sources of transistors $Q_8$ 432 and $Q_9$ 434 are coupled to a supply voltage $V_A$. In one example, transistor $Q_8$ 432 and transistor $Q_9$ 434 may be matched to have substantially the same W/L to provide substantially same current through each of the transistors $Q_8$ 432 and $Q_9$ 434. In alternative embodiments, the ratio of W/L between transistor $Q_8$ 432 and transistor $Q_9$ 434 may be other than one to provide a fixed ratio between first current $I_1$ 440 and second current $I_2$ 444 through the transistors $Q_8$ 432 and $Q_9$ 434.

The gates (control terminals) of transistors $Q_8$ 432 and $Q_9$ 434 are coupled to receive a bias voltage $V_{BIAS}$. In one example, the bias voltage $V_{BIAS}$ is a voltage generated by a separate circuit that is not included in low threshold voltage comparator 400 and provided to current generation circuit 409 to maintain first current $I_1$ 440 and second current $I_2$ 444 through the transistors $Q_8$ 432 and $Q_9$ 434 substantially independent of temperature. In another example, the bias voltage $V_{BIAS}$ may be generated by a circuit that is included in low threshold voltage comparator 400. In addition, the bias voltage $V_{BIAS}$ may be coupled to the control terminal of a transistor $Q_{10}$ 436 and used to set the amount of current in a third branch of amplifier 408 that includes transistors $Q_{10}$ 436, $Q_{11}$ 438 and $Q_{12}$ 450. In the illustrated example, the bias voltage $V_{BIAS}$ and W/L ratios of transistors $Q_8$ 432 and $Q_9$ 434 are chosen to generate a current of 10 μA for first current $I_1$ 440 and second current $I_2$ 444.

In FIG. 4, clamp circuit 403 includes a transistor $Q_4$ 422 coupled between amplifier input 412 and the emitter (a non-controlling terminal) of transistor $Q_2$ 424, which is coupled to ground 405. In one example, ground 405 may be substantially zero volts. In clamp circuit 403, transistor $Q_4$ 422 is a BJT and its base (a controlling terminal) and its collector (a non-controlling terminal) are coupled to ground 405. As such, when the voltage on amplifier input 412 drops more than the turn-on voltage of transistor $Q_4$ 422 below ground 405, transistor $Q_4$ 422 turns on and starts conducting current. In one example, the turn on voltage of transistor $Q_4$ 422 is 0.7V so when amplifier input 412 reaches −0.7V, transistor $Q_4$ 422 turns on and clamps the voltage on amplifier input 412 at −0.7V (i.e., zero volts minus the turn-on voltage of transistor $Q_4$ 422).

Level shift circuit 406 is one example of level shift circuit 306 and includes a resistor $R_1$ which may have a resistance of 2 k Ohms. Excluding the case when clamp circuit 403 or anti-saturation circuit 407 are activated, when transistor $Q_1$ 420 is turned on and conducting current, the current through the resistor R1 becomes equal to the current through the emitter terminal of transistor $Q_1$ 420 (which is approximately first current I1 440, which may be 10 μA). In this example, level shift circuit 406 may produce a voltage difference of 20 mV (resistance of the resistor $R_1$ multiplied by first current $I_1$ 440) across the resistor $R_1$. This means that level shift circuit 406 raises the voltage level of input signal $U_{IN}$ 402 by 20 mV and provides level-shifted input signal $U_{LS}$ 416 to amplifier input 412.

As previously mentioned, the voltage level of level-shifted input signal $U_{LS}$ 416 may be 20 mV above the voltage level of input signal $U_{IN}$ 402. In other words, when the input signal $U_{IN}$ 402 is −20 mV level-shifted input signal $U_{LS}$ 416 on amplifier input 412 is zero volts. When level-shifted input signal $U_{LS}$ 416 at amplifier input 412 is equal to zero volts, the base to emitter voltage of transistor $Q_1$ 420 becomes equal to the base to emitter voltage of transistor $Q_2$ 424. Under this condition, transistors $Q_1$ 420 and $Q_2$ 424, if chosen as identical transistors, demand substantially the same amount of collector current. As previously mentioned, transistors $Q_1$ 420 and $Q_2$ 424 are BJTs and thus, need to have some current through their base terminals to conduct current. Since the base and collector terminals of transistor $Q_1$ 420 are coupled together and the base terminal of transistor $Q_2$ 424 is coupled to the base terminal of transistor $Q_1$ 420, a portion of first current $I_1$ 440 goes to the base terminals of transistors $Q_1$ 420 and $Q_2$ 424 to provide necessary base currents. Therefore, the collector current of transistor $Q_1$ 420 is less than first current $I_1$ 440 and similarly, the collector current of transistor $Q_2$ 424 is less than second current $I_2$ 444. In other words, the collector current that transistor $Q_2$ 424 demands is less than second current $I_2$ 444 that current generation circuit 409 provides to the second branch. As a consequence, the voltage level of the output signal $U_{OUT}$ 418 at amplifier output 414 increases. When level-shifted input signal $U_{LS}$ 416 is substantially zero volts, the voltage level of output signal $U_{OUT}$ 418 increases to a level that is just sufficient to cross the threshold of output circuit 410 so that comparator output signal $U_{CO}$ 404 becomes logic high.

When level-shifted input signal $U_{LS}$ 416 at amplifier input 412 increases above zero volts, the base voltage of transistor $Q_1$ 420 attempts to increase because the base and the collector of transistor $Q_1$ 420 are coupled together to form a diode connected BJT but transistor $Q_2$ 424, whose base terminal is also coupled to the base terminal of transistor $Q_1$ 420, keeps the base voltage of transistor $Q_1$ 420 relatively constant, effectively reducing the base to emitter voltage of transistor $Q_1$ 420. First current $I_1$ 440 does not change however and therefore, a larger portion of first current $I_1$ 440 goes to the base terminal of transistor $Q_2$ 424. This increases the collector current of transistor $Q_2$ 424 and reduces the difference between second current $I_2$ 444 and the collector current of transistor $Q_2$ 424, resulting in the reduction of the voltage level of output signal $U_{OUT}$ 418 at amplifier output 414. As the voltage level of output signal $U_{OUT}$ 418 decreases from the level that it reached when level-shifted input signal $U_{LS}$ 416 was zero volts, output signal $U_{OUT}$ 418 becomes less than the threshold of output circuit 410 and hence, comparator output signal $U_{CO}$ 404 becomes logic low. When level-shifted input signal $U_{LS}$ 416 decreases below zero volts, the base voltage of transistor $Q_1$ 420 decreases, reducing the base to emitter voltage of transistor $Q_2$ 424 and hence, the collector current of transistor $Q_2$ 424. This increases the difference between second current $I_2$ 444 and the collector current of transistor $Q_2$ 424, resulting in an increase in the voltage level of output signal $U_{OUT}$ 418. As the voltage level of output signal $U_{OUT}$ 418 increases from the level that it reached when the level-shifted input signal $U_{LS}$ 416 was zero volts, output signal $U_{OUT}$ 418 becomes even more positive with respect to the threshold of output circuit 410 and hence, comparator output signal $U_{CO}$ 404 remains logic high. It is in this manner that low threshold voltage comparator 400 sets comparator output signal $U_{CO}$ 404 to logic high when input signal $U_{IN}$ 402 is below the negative threshold voltage (e.g., −20 mV) and sets comparator output signal $U_{CO}$ 404 to logic low when input signal $U_{IN}$ 402 is above the negative threshold voltage.

In embodiments where first current $I_1$ 440 and second current $I_2$ 444 are matched to have a substantially fixed ratio, transistors $Q_8$ 420 and $Q_9$ 424 may also be ratio matched to the same substantially fixed ratio so that the negative threshold voltage of low threshold voltage comparator 400 of FIG. 4 and its operation are unchanged.

Anti-saturation circuit 407 includes a transistor $Q_5$ 428 coupled between the first branch and the second branch. In the example anti-saturation circuit 407, transistor $Q_5$ 428 is a MOSFET and the control terminal of transistor $Q_5$ 428 is coupled to the control terminal of transistor $Q_{11}$ 438. In the example amplifier 408, transistor $Q_{11}$ 438 is a BJT. As such, control terminal of transistor $Q_5$ 428 corresponds to the gate terminal of transistor $Q_5$ 428 and control terminal of transistor $Q_{11}$ 438 corresponds to the base terminal of transistor $Q_{11}$ 438. Therefore, the base voltage of transistor $Q_{11}$ 438 sets the gate voltage of transistor $Q_5$ 428. Assuming that the current in the third branch of amplifier 408 is small (to reduce power dissipation), the base to emitter voltage of transistor $Q_{11}$ 438 is forced to be substantially equal to the turn-on voltage of transistor $Q_{11}$ 438 because the base of transistor $Q_{11}$ 438 is coupled to the collector of transistor $Q_{11}$ 438. Similarly, the gate to drain voltage of transistor $Q_{12}$ 450 is forced to be substantially equal to the threshold voltage of transistor $Q_{12}$ 450 because the gate and drain terminals of transistor $Q_{12}$ 450 are coupled together. In one example, transistors $Q_5$ 428 and $Q_{12}$ 450 have equal threshold voltages of 0.9V and transistor $Q_{11}$ 438 has a turn-on voltage of 0.7V. Consequently, the gate voltage of transistor $Q_5$ 428 may equate to the sum of the base to emitter voltage of transistor $Q_{11}$ 438 plus the gate to source voltage of transistor $Q_{12}$ 450. In other words, the gate voltage of transistor $Q_5$ 428 may be equal to 1.6V, in one example.

When the voltage on the source terminal of transistor $Q_5$ 428 drops more than the threshold voltage of transistor $Q_5$ 428 below the gate voltage of transistor $Q_5$ 428, transistor $Q_5$ 428 turns on and starts conducting current. When transistor $Q_5$ 428 is conducting, it diverts at least a portion of the current through the first branch to the collector terminal of transistor $Q_2$ 424 instead of toward the collector and base of transistor $Q_1$ 420. Since the collector of transistor $Q_1$ 420, the base of transistor $Q_1$ 420, and the base of transistor Q2 424 are coupled together, the portion of first current $I_1$ 440 going to the base of transistor $Q_2$ 424 may increase to a certain level in response to increasing voltage on amplifier input 412 (i.e., decreasing base to emitter voltage of transistor $Q_1$ 420) such that the resulting increase in the collector current that transistor $Q_2$ 424 demands may reduce the voltage on the collector terminal (i.e., the collector to emitter voltage) of transistor $Q_2$ 424, causing transistor $Q_2$ 424 to become saturated. Therefore, transistor $Q_5$ 428 can effectively divert at least a portion of the first current in the first branch to the second branch to prevent the saturation of transistor $Q_2$ 424, in response to level-shifted signal $U_{LS}$ 416 reaching a certain threshold voltage, where level-shifted signal $U_{LS}$ 416 causes a voltage on the source of transistor $Q_5$ 428 (also, the voltage on the collector of transistor $Q_2$ 424) to drop far enough to turn on transistor $Q_5$ 428.

Output circuit 410 is one example of output circuit 310 and includes two substantially identical inverters, inverter 446 and inverter 448, with equal threshold voltages. In operation, when the voltage at the input of output circuit 410 (i.e., the voltage on amplifier output 414) is below the threshold voltage of inverter 446, the output of inverter 446 goes to a voltage that is above the threshold voltage of inverter 448 and subsequently, a comparator output signal $U_{CO}$ 404 (the output of low threshold voltage comparator 400) of output circuit 410 becomes logic low. Conversely, when the output voltage at the input of output circuit 410 is above the threshold voltage of inverter 446, the output of inverter 446 goes to a voltage that is below the threshold voltage of inverter 448 and subsequently, comparator output signal $U_{CO}$ 404 of output circuit 410 becomes logic high.

In an alternative embodiment of low threshold voltage comparator 400, level shift circuit 406 may be eliminated and input signal $U_{IN}$ 402 may be provided directly to amplifier input 412. In one example, to achieve a negative threshold voltage (e.g., −20 mV) for low threshold voltage comparator 400, transistors $Q_8$ 432 and $Q_9$ 434 may be matched to a fixed first ratio and similarly, transistors $Q_1$ 420 and $Q_2$ 424 may be matched to have a fixed second ratio where the first ratio is different from the second ratio. For example, transistors $Q_1$ 420, $Q_2$ 424, $Q_8$ 432 and $Q_9$ 434 may be configured such that the first ratio is greater than the second ratio. This means that for the same base to emitter voltage (e.g., when input signal $U_{OUT}$ 402 is zero volts) transistor $Q_2$ 424 demands a collector current that is greater than second current $I_2$ 444 that transistor $Q_9$ 434 can provide to the second branch, causing output signal $U_{OUT}$ 418 to drop below the threshold of output circuit 410. Therefore, input signal $U_{OUT}$ 402 needs to decrease from zero volts to a certain negative voltage such that the base to emitter voltage of transistor $Q_2$ 424 decreases. When the base to emitter voltage of transistor $Q_2$ 424 decreases, the collector current of transistor $Q_2$ 424 also decreases by a certain amount and in turn, allows for output signal $U_{OUT}$ 418 to rise to a level that is sufficient to cross the threshold of output circuit 410. This negative voltage can be considered the negative threshold voltage for low threshold voltage comparator 400.

In FIG. 4, transistors $Q_6$ 426 and $Q_7$ 430 are shown as N-channel MOSFETs. Transistor $Q_6$ 426 is coupled in the first branch of amplifier 408 and transistor $Q_7$ 430 is coupled in the second branch of amplifier 408. Transistors $Q_6$ 426 and $Q_7$ 430 both have the same W/L ratio and because the drain of transistor $Q_6$ 426 is coupled to the gate of both transistor $Q_6$ 426 and transistor $Q_7$ 430, transistors $Q_6$ 426 and $Q_7$ 430 simply pass substantially the same current values flowing through the first branch and the second branch. For example, if first current $I_1$ 440 and second current $I_2$ 444 are both 10 µA, 10 µA will flow out of each of the sources of transistors $Q_6$ 426 and $Q_7$ 430.

Transistors $Q_6$ 426 and $Q_7$ 430 may be referred to as an impedance boosting circuit because they are coupled to pass first current $I_1$ 440 and second current $I_2$ 444 down the first and second branch, while also increasing the output impedance of amplifier 408. Therefore, a smaller change in second current $I_2$ 444 can now produce a greater change in voltage level of output signal $U_{OUT}$ 418. In other words, the same change in the voltage level of input signal $U_{IN}$ 402 can produce a larger change in the voltage level of output signal $U_{OUT}$ 418 on amplifier output 414, ultimately improving the response time of amplifier 408 to input signal $U_{IN}$ 402. In the illustrated example, the impedance boosting circuit (transistors $Q_6$ 426 and $Q_7$ 430) is coupled to the first branch and the second branch of amplifier 408. Transistor $Q_7$ 430 is coupled between transistor $Q_2$ 424 and amplifier output 414, in FIG. 4.

Figure 5:
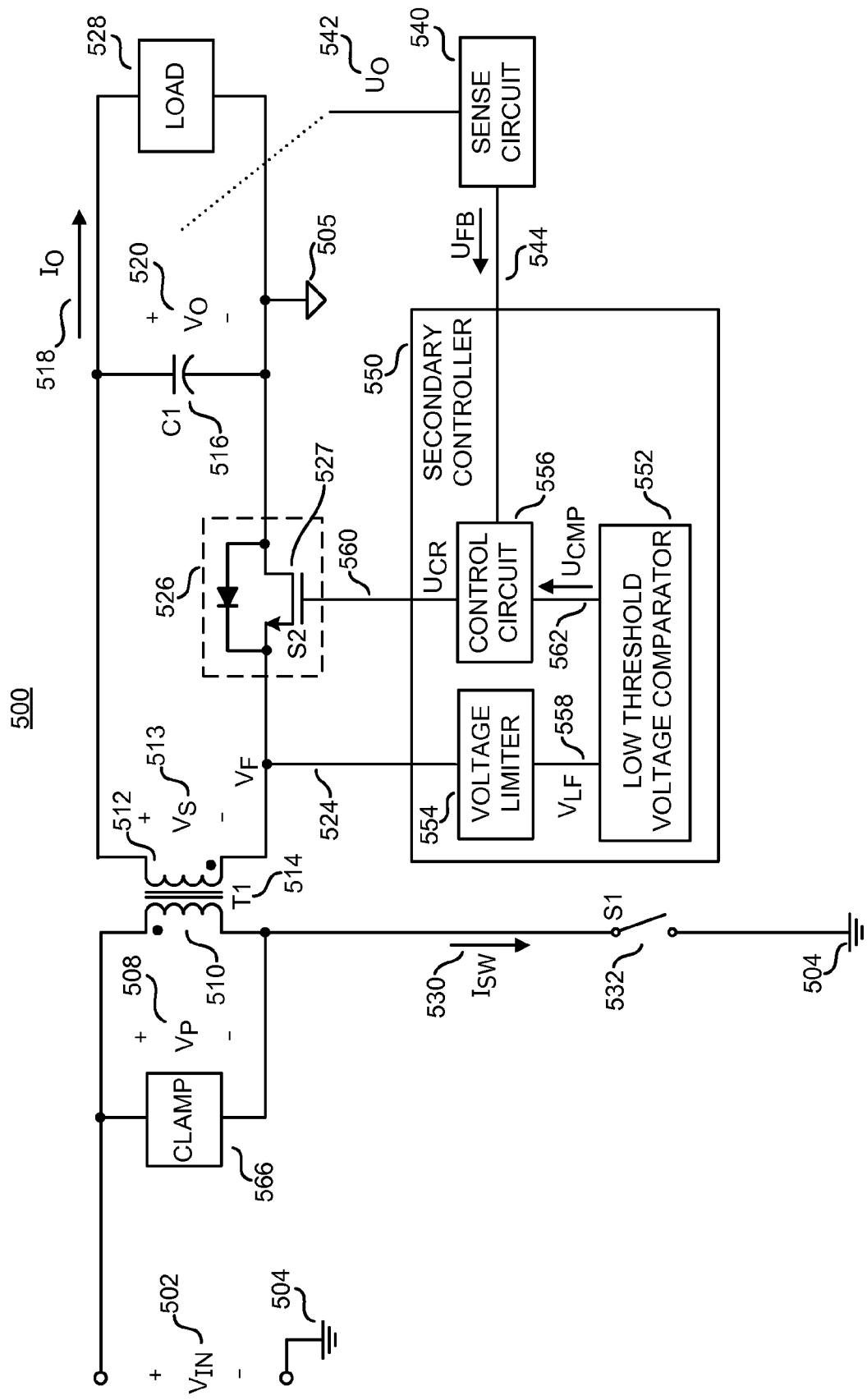
FIG. 5 shows a schematic of one example of a synchronous flyback switch mode power converter that includes a secondary controller that utilizes a low threshold voltage comparator, in accordance with the teachings of the present invention.

FIG. 5 shows a schematic of one example of a synchronous flyback switch mode power converter 500 that includes a secondary controller 550 that utilizes a low threshold voltage comparator 552, in accordance with the teachings of the present invention. In the example illustrated in FIG. 5, synchronous flyback switch mode power converter 500 utilizes secondary control. It is appreciated that secondary control for a flyback converter has advantages of tighter output regulation and faster response to load transients.

Synchronous flyback switch mode power converter 500 receives an unregulated input voltage $V_{IN}$ 502 at the input to produce an output voltage $V_O$ 520 and an output current $I_O$ 518 to an electrical load 528. Input voltage $V_{IN}$ 502 may be a rectified and filtered ac voltage. As shown, input voltage $V_{IN}$ 502 is referenced to a primary ground 504, also referred to as an input return and output voltage $V_{OUT}$ 520 is referenced to a secondary ground 505, also referred to as an output return. In other examples, synchronous flyback switch mode power converter 500 may have more than one output.

As further shown in FIG. 5, synchronous flyback switch mode power converter 500 includes secondary controller 550 to control the circuits of power converter 500 to regulate the output voltage $V_O$ 520 at a desired voltage level. It should be noted that synchronous flyback switch mode power converter 500 may also include a primary controller (not shown in FIG. 5) that controls a switching device S1 532 to control the energy transfer from the input to the output of synchronous flyback switch mode power converter 500. In one example, synchronous flyback switch mode power converter 500 may regulate output voltage $V_O$ 520 to the desired voltage level after a startup period. The startup period may be a period of time starting from when synchronous flyback switch mode power converter 500 is introduced to input voltage $V_{IN}$ 502 until secondary controller 550 begins operating to regulate output voltage $V_O$ 520. In the example synchronous flyback switch mode power converter 500, an output capacitor C1 516 is coupled to the output to smooth out the ripple in output voltage $V_O$ 520.

Also included in FIG. 5 is an energy transfer element T1 514 that is illustrated as a coupled inductor with a primary winding 510 and a secondary winding 512. Energy transfer element T1 514 is coupled to transfer energy from primary winding 510 to secondary winding 512. Circuits that are electrically coupled to primary winding 510 may be referred to as the primary side of synchronous flyback switch mode power converter 500. Similarly, circuits that are electrically coupled to secondary winding 512 may be referred to as the secondary side of synchronous flyback switch mode power converter 500. Energy transfer element T1 514 provides galvanic isolation between circuits on the primary side of synchronous flyback switch mode power converter 500 and circuits on the secondary side of synchronous flyback switch mode power converter 500. In other words, a dc voltage applied between the primary side and the secondary side of synchronous flyback switch mode power converter 500 will produce substantially zero current.

In the depicted example, switching device S1 532 is coupled to energy transfer element T1 514 at primary winding 510 and coupled to the input of synchronous flyback switch mode power converter 500 at input return 504. Switching device S1 532 may be a metal MOSFET, BJT, or the like. As shown, secondary controller 550 is coupled to the circuits on the secondary side such as a synchronous rectification circuit 526, secondary winding 512 along with other circuit components. In operation, secondary controller 550 controls the circuits of synchronous flyback switch mode power converter 500 (e.g., synchronous rectification circuit 526) to control energy transfer through energy transfer element T1 514 from the input to the output of synchronous flyback switch mode power converter 500.

A clamp circuit 566 is coupled across primary winding 510 of energy transfer element T1 514 and to the input of synchronous flyback switch mode power converter 500. Clamp circuit 566 operates to clamp any turn-off spikes that result from leakage inductance from primary winding 510 across the switching device S1 532.

Switching device S1 532 may operate in an ON state (e.g., as a closed switch) or in an OFF state (e.g., as an open switch) in response to a drive signal (not shown in FIG. 5) that may be coupled to control the switching of switching device S1 532. By controlling the switching of switching device S1 532, the drive signal may control a primary current $I_{SW}$ 530 through switching device S1 532 and primary winding 510. When switching device S1 532 is ON, the current through primary winding 510 (i.e., primary current $I_{SW}$ 530) increases the energy stored in energy transfer element T1 514. A primary winding voltage $V_P$ 508 with a first polarity develops across primary winding 510. A secondary winding voltage $V_S$ 513 with an opposite polarity of $V_P$ 508 develops across secondary winding 512 when switching device S1 532 is in ON state. Synchronous rectification circuit 526 may act as an open circuit corresponding to times when secondary winding voltage $V_S$ 513 is a negative voltage.

Switching device S1 532 may transition from the ON state to the OFF state, thereby blocking the current through switching device S1 532 when primary current $I_{SW}$ 530 reaches a current limit, which in one example is a fixed limit. When switching device S1 532 transitions from the ON state to the OFF state, secondary winding voltage $V_S$ 513 becomes a positive voltage and allows for energy to be transferred to output capacitor C1 516, providing power to electrical load 528. In one example, secondary controller 550 may control synchronous rectification circuit 526 to act as a closed switch (i.e., to conduct current) when secondary winding voltage $V_S$ 513 transitions to a positive voltage so that output capacitor C1 516 is charged.

In the depicted example, secondary controller 550 includes a voltage limiter 554, a control circuit 556, and a low threshold voltage comparator 552. In one example, voltage limiter 554 is coupled to sense a forward voltage $V_F$ 524 representative of secondary winding voltage $V_S$ 513 and to generate a limited version of forward voltage $V_F$ 524. In one example, forward voltage $V_F$ 524 is substantially equal to the sum of output voltage $V_O$ 520 and secondary winding voltage $V_S$ 513. In the illustrated example, voltage limiter 554 generates a limited forward voltage $V_{LF}$ 558, representative of a limited version of forward voltage $V_F$ 524, by limiting the positive amplitude of limited forward voltage $V_{LF}$ 558. As an example, limited forward voltage $V_{LF}$ 558 may be the same as forward voltage $V_F$ 554 except for its positive amplitude which may be limited to approximately 4.3V.

Low threshold voltage comparator 552 is coupled to receive limited forward voltage $V_{LF}$ 558 and to produce a comparator signal $U_{CMP}$ 562. In the illustrated example, voltage comparator 552 may be implemented using voltage comparators 100, 300, or 400. As such, limited forward voltage $V_{LF}$ 558 may corresponds to signals 102, 202, 302, and 402. Similarly, comparator signal $U_{CMP}$ 562 may correspond to signals 104, 204, 304, and 404. In operation, when limited forward voltage $V_{LF}$ 558 drops below the negative threshold voltage (e.g., −20 mV), low threshold voltage comparator 552 sets comparator signal $U_{CMP}$ 562 to logic high and when limited forward voltage $V_{LF}$ 558 goes above the negative threshold voltage, low threshold voltage comparator 552 sets comparator signal $U_{CMP}$ 562 to logic low.

As further illustrated in FIG. 5, control circuit 556 is coupled to receive comparator signal $U_{CMP}$ 562 and a feedback signal $U_{FB}$ 544, which is representative of an output quantity $U_O$ 542 of synchronous flyback switch mode power converter 500. Output quantity $U_O$ 542 may include output voltage $V_O$ 520 and/or output current $I_O$ 518. In one example, a sense circuit 540 is coupled to sense output quantity $U_O$ 542 and to generate feedback signal $U_{FB}$ 544 in response to output quantity $U_O$ 542. In the illustrated example, secondary controller 550 is coupled to sense circuit 540 to receive feedback signal $U_{FB}$ 544 at a feedback terminal of secondary controller 550. In FIG. 5, control circuit 556 is coupled to generate a control signal $U_{CR}$ 560 in response to comparator signal $U_{CMP}$ 562 and in response to feedback signal $U_{FB}$ 544.

Control signal $U_{CR}$ 560 controls synchronous rectification circuit 526. As further shown in FIG. 5, synchronous rectification circuit 526 is coupled to secondary winding 512 on the secondary side of synchronous flyback switch mode power converter 500. In the illustrated example, synchronous rectification circuit 526 includes a switch S2 527 controlled by control signal $U_{CR}$ 560 from secondary controller 550. In one example, switch S2 527 is a MOSFET whose gate is coupled to be controlled by control signal $U_{CR}$ 560. Switch S2 527 may operate in the ON state (i.e., switch S2 527 is turned ON) or in the OFF state (i.e., switch S2 527 is turned OFF) depending on control signal $U_{CR}$ 560. When turned ON by the control signal $U_{CR}$ 560 from control circuit 556, switch S2 527 of synchronous rectification circuit 526 may conduct current. In the illustrated example, synchronous rectification circuit 526 includes a diode, which may be a discrete component or may be included in the same component as the illustrated switch (e.g., body diode of the MOSFET). In one example, control circuit 556 may adjust control signal $U_{CR}$ 560 such that switch S2 527 operates in ON state when comparator signal $U_{CMP}$ 562 is logic high and in OFF state when comparator signal $U_{CMP}$ 562 is logic low.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A voltage comparator for use in a power converter controller, comprising:
    an amplifier coupled to receive an input signal at an amplifier input and generate an output signal at an amplifier output in response to the input signal, the amplifier including:
        a current generation circuit coupled to generate a first current and a second current, wherein a ratio of the first current to the second current is substantially constant, the first current to flow through a first branch and the second current to flow through a second branch;
        a first transistor having a first terminal, a second terminal, and a first control terminal, wherein the first terminal is coupled to the amplifier input and the second terminal is coupled to the first branch and to the first control terminal;
        a second transistor having a third terminal, a fourth terminal, and a second control terminal, wherein the second control terminal is coupled to the first control terminal, the third terminal is coupled to the second branch, and the fourth terminal is coupled to a reference voltage; and
        an anti-saturation circuit coupled between the first branch and the second branch to prevent saturation of the second transistor in response to the input signal reaching a first threshold voltage; and
    an output circuit coupled to the amplifier output to generate a comparator output signal in response to the output signal, wherein the amplifier output is coupled to the second branch.

2. The voltage comparator of claim 1, wherein the amplifier further includes a clamp circuit coupled to the amplifier input to clamp the input signal from reaching a second threshold voltage relative to the reference voltage.

3. The voltage comparator of claim 2, wherein the clamp circuit includes a third transistor coupled between the fourth terminal of the second transistor and the amplifier input, a third control terminal of the third transistor coupled to the fourth terminal of the second transistor.

4. The voltage comparator of claim 1, wherein the anti-saturation circuit includes a third transistor coupled to divert a portion of the first current to flow in to the third terminal of the second transistor instead of flowing in to the second control terminal of the second transistor, in response to the input signal crossing the first threshold voltage.

5. The voltage comparator of claim 1, wherein the current generation circuit includes a pair of transistors coupled together at their control terminals, and wherein the pair of transistors are matched so that the first current and the second current have substantially a same value.

6. The voltage comparator of claim 5, wherein the pair of transistors are coupled to be biased to maintain the first and second currents substantially independent of temperature.

7. The voltage comparator of claim 1, wherein the amplifier further comprises an impedance boosting circuit coupled to the first and second branch to increase the output impedance of the amplifier output, and wherein the impedance boosting circuit is coupled to the second branch between the amplifier output and the second transistor.

8. The voltage comparator of claim 7, wherein the impedance boosting circuit includes a pair of transistors coupled together at their controlling terminals.

9. The voltage comparator of claim 1, wherein the output circuit includes an inverter coupled to receive the output signal from the amplifier output and output a logic value based on whether a level of the output signal is above a threshold value of the inverter.

10. The voltage comparator of claim 1, wherein the first transistor and the second transistor are bipolar junction transistor ("BJTs").

11. The voltage comparator of claim 1 further comprising a level shift circuit coupled to the input of the amplifier, wherein the level shift circuit generates a level-shifted version of the input signal on the amplifier input in response to receiving the input signal.

12. The voltage comparator of claim 1, wherein the ratio of the first current to the second current is greater than a ratio matching of the first transistor to the second transistor, and wherein the output circuit switches a logic level of the comparator output signal in response to the input signal crossing a second threshold voltage, wherein the second threshold voltage is negative relative to the reference voltage.

* * * * *